(12) United States Patent
Sekihara et al.

(10) Patent No.: US 8,569,163 B2
(45) Date of Patent: Oct. 29, 2013

(54) ULTRASONIC WIRE BONDING METHOD FOR A SEMICONDUCTOR DEVICE

(75) Inventors: Masahiko Sekihara, Kanagawa (JP); Takanori Okita, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 173 days.

(21) Appl. No.: 13/335,094

(22) Filed: Dec. 22, 2011

(65) Prior Publication Data

US 2012/0164795 A1    Jun. 28, 2012

(30) Foreign Application Priority Data

Dec. 27, 2010  (JP) .................................. 2010-290036

(51) Int. Cl.
*H01L 21/44*    (2006.01)
(52) U.S. Cl.
USPC ................. 438/617; 257/784; 257/E21.509; 257/E21.518; 257/E21.481; 257/E21.627
(58) Field of Classification Search
USPC ................ 438/617; 257/E21.509, E21.578, 257/E21.481, E21.627, 784
See application file for complete search history.

(56) References Cited

U.S. PATENT DOCUMENTS

| | | | | |
|---|---|---|---|---|
| 5,364,009 A | * | 11/1994 | Takahashi et al. | ......... 228/110.1 |
| 2005/0090091 A1 | * | 4/2005 | Ishikawa et al. | ............. 438/617 |
| 2006/0138679 A1 | * | 6/2006 | Kawanabe et al. | ........... 257/784 |

FOREIGN PATENT DOCUMENTS

JP    1-205538    8/1989

* cited by examiner

*Primary Examiner* — Kimberly Rizkallah
*Assistant Examiner* — Maria Ligai
(74) *Attorney, Agent, or Firm* — Womble Carlyle

(57) ABSTRACT

A risk of an electrical short between electrode pads of a semiconductor device can be reduced to thereby improve quality of the semiconductor device. During ball bonding in wire bonding, in each of the electrode pads of a semiconductor chip which are arrayed along an ultrasonic wave application direction (ultrasonic vibration direction), a ball at the tip of a copper wire and the electrode pad are coupled to each other while being rubbed against each other in a direction intersecting the ultrasonic wave application direction. Thus, the amount of AL splash formed on the electrode pad can be minimized to make the AL splash smaller. As a result, the quality of the semiconductor device assembled by the above-mentioned ball bonding can be improved.

23 Claims, 18 Drawing Sheets

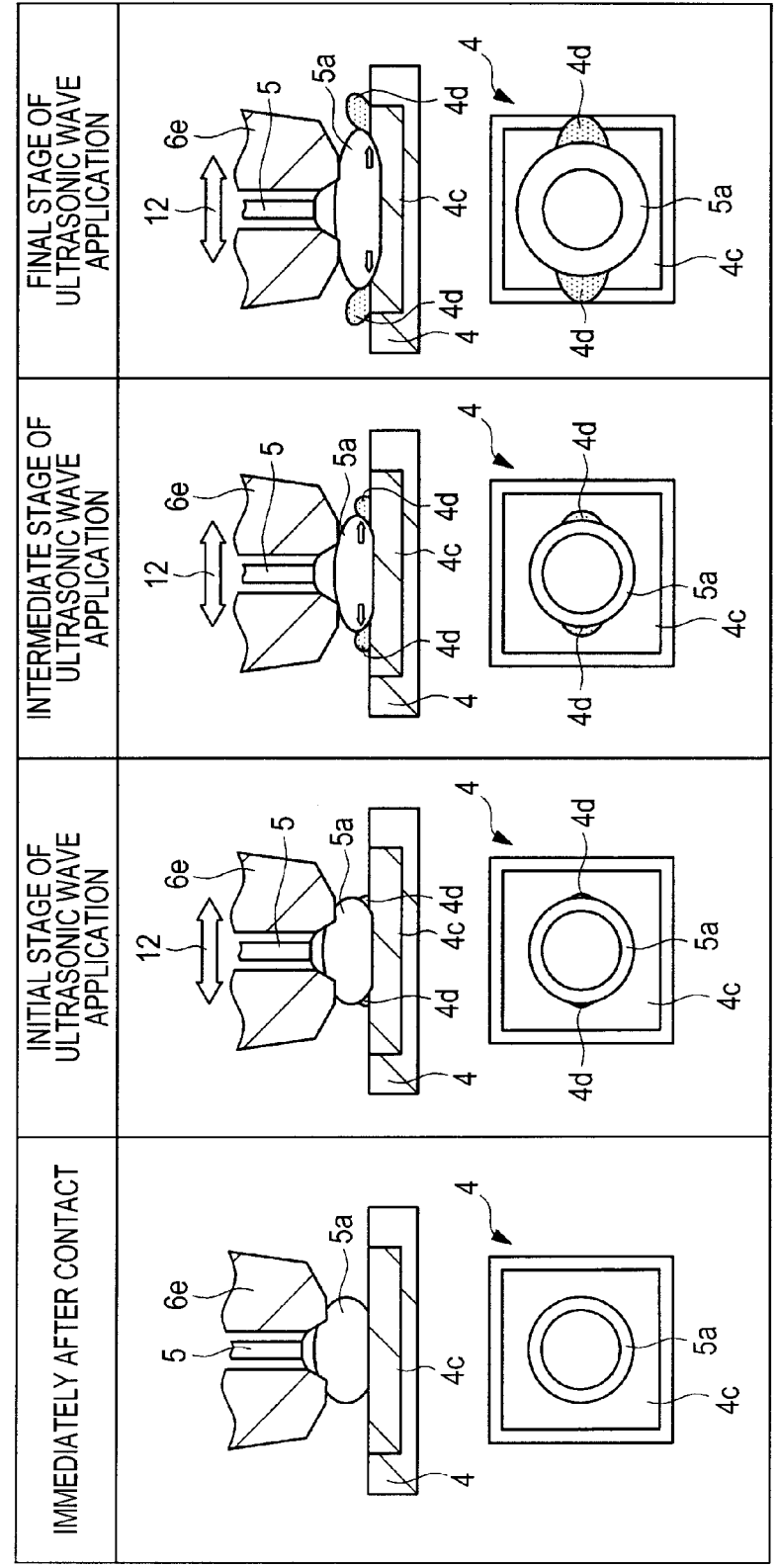

ULTRASONIC WIRE BONDING METHOD FOR A SEMICONDUCTOR DEVICE

CROSS-REFERENCE TO RELATED APPLICATIONS

The disclosure of Japanese Patent Application No. 2010-290036 filed on Dec. 27, 2010 including the specification, drawings and abstract is incorporated herein by reference in its entirety.

BACKGROUND

The present invention relates to a manufacturing method of a semiconductor device, and more specifically relates to a technique effectively applied to improving the quality of a semiconductor device.

For example, Japanese Unexamined Patent Application No. Hei 1(1989)-205538 describes a technique in which during wire bonding using copper wire, when forming a ball at the tip of the copper wire, the ball is formed in a reducing gas atmosphere, and heating is controlled so that the reducing gas atmosphere is within a predetermined temperature range, thereby achieving good bondability.

SUMMARY

In wire bonding which electrically couples electrode pads of a semiconductor chip to inner leads of a lead frame via a metallic wire (conductive wire), gold is mainly used as the material of the wire. However, the recent surge in gold price has led to a demand for an alternative material to gold. Copper is known as a wire material that is cheaper than gold.

Copper wire is applied to wire bonding not only because of cost reduction but also because copper wire has higher electrical conductivity than gold wire and is thus also superior in terms of electrical characteristics.

After conducting studies on wire bonding using copper wire, the present inventors have found that the following phenomenon occurs.

That is, in wire bonding (ball bonding) using copper wire, when bonding the copper wire to an electrode pad made of AL, (aluminum) (hereinafter, also simply referred to as AL pad) in a semiconductor chip by applying ultrasonic wave, because copper has high hardness (is hard) in comparison to gold, splash (squeeze-out) of AL in the application direction of ultrasonic wave becomes severe.

This AL splash occurs in a first direction along the application direction of ultrasonic wave (ultrasonic vibration direction).

In this connection, FIG. 22 are a partial perspective view and a plan view, respectively showing the structure of the principal part of a wire bonder used in wire bonding according to a comparative example, and the state of formation of AL splash. FIGS. 23A to 23D are a partial cross-sectional view and a plan view each showing the state of formation of AL splash with respect to the application time of ultrasonic wave in the wire bonding according to the comparative example.

As shown in FIG. 22, a bonding head 6b of a wire bonder 20 used for ball bonding is provided with an ultrasonic horn 6d that excites ultrasonic wave, and a capillary 6e that is attached to the tip of the ultrasonic horn 6d and guides a copper wire 5. Wire bonding is performed by vibrating the ultrasonic horn 6d in an ultrasonic vibration direction (application direction of ultrasonic wave) 12 to thereby apply ultrasonic wave to the copper wire 5 via the capillary 6e.

At that time, among a plurality of electrode pads 4c formed in a main surface 4a of a semiconductor chip 4, in the electrode pads 4c arrayed along the ultrasonic vibration direction 12, an AL splash 4d is squeezed out in a first direction along the ultrasonic vibration direction 12 and formed so as to stick out on either side of a ball 5a. That is, the principal component of the electrode pad 4c is AL, and the AL is rubbed by the hard copper wire 5 and squeezed out to either side of the ball 5a.

Therefore, in the case of the semiconductor chip 4 with a short distance between adjacent pads such as a fine pad pitch product, there is a problem in that the AL splashes 4d of adjacent pads come into contact with each other as shown in region A, leading to an electrical short.

As for the growth of the AL splash 4d, as shown in the time series stages A to D in FIGS. 23A to 23D, although the AL splash 4d has not been formed yet in the stage A immediately after the copper wire 5 comes into contact with the electrode pad 4c, the AL splash 4d begins to be formed in a first direction along the ultrasonic vibration direction 12 in the initial stage B of ultrasonic wave application. Thereafter, the AL splash 4d grows as the ball 5a of the copper wire 5 is squashed and spreads out in the intermediate stage C of ultrasonic wave application, and finally, the AL splash 4d further grows larger as the ball 5a of the copper wire 5 is further squashed and spreads out in the final stage D of ultrasonic wave application.

As described above, among the plurality of electrode pads 4c, the electrode pads 4c arrayed along the ultrasonic vibration direction (application direction of ultrasonic wave) 12 are prone to the risk of a potential electrical short, which poses a significant problem for a fine pad pitch product or the like.

It would be conceivable to make the ultrasonic wave weaker to suppress formation of the AL splash 4d. However, as the applied ultrasonic wave is made weaker, bondability of wire bonding deteriorates, making it impossible to perform bonding.

Further, as the AL splash 4d becomes larger, this also causes a problem of reduced process margin due to electrical short between adjacent pads, and deterioration of quality, reliability, etc, of the semiconductor device becomes a problem. In particular, this presents a significant problem in applying Cu (copper) wire to a fine pad pitch product with a fine pitch between adjacent pads.

While Japanese Unexamined Patent Application No, Hei 1(1989)-205538 mentioned above describes the technique which forms a ball in a reducing gas atmosphere in wire bonding using copper wire, there is no description about AL splash which is formed during wire bonding, and presumably, due to the high hardness of copper wire, it would be difficult to suppress the amount of AL splash formed on the electrode pad.

The present invention has been made in view of the above-mentioned problems, and accordingly provides a technique that can improve the quality of a semiconductor device.

The present invention also provides a technique that can improve the reliability of a semiconductor device.

The above and other objects, and novel features of the present invention will become apparent from the following description of the specification and the attached drawings.

A brief description is given below of representative embodiments of the invention disclosed in the present application.

A manufacturing method of a semiconductor device according to a representative embodiment is a manufacturing method of a semiconductor device which forms a ball at a tip of a conductive wire passed through a capillary as a bonding tool, and performs wire bonding of the ball to an electrode pad of a semiconductor chip, and includes the steps of (a) providing the semiconductor chip having a plurality of electrode pads formed in a main surface, and (b) electrically coupling the ball at the tip of the conductive wire to each of the electrode pads of the semiconductor chip by applying an ultrasonic wave. The conductive wire includes copper as a principal component. Each of the electrode pads includes aluminum as a principal component, In the step (h), when performing the wire bonding to, among the electrode pads, the electrode pads that are arrayed in a first direction along an application direction of the ultrasonic wave, the ball and each of the electrode pads are coupled to each other while being rubbed against each other in a second direction transverse to the application direction of the ultrasonic wave.

A manufacturing method of a semiconductor device according to another representative embodiment is a manufacturing method of a semiconductor device which forms a ball at a tip of a conductive wire passed through a capillary as a bonding tool, and performs wire bonding of the ball to an electrode pad of a semiconductor chip, and includes the steps of (a) providing a multiple lead frame having a plurality of device areas provided in a matrix arrangement, the device areas each having a chip mounting part over which the semiconductor chip is mounted, and a plurality of leads arranged around the chip mounting part, (b) mounting the semiconductor chip having a plurality of electrode pads formed in a main surface, over the chip mounting part of the lead frame, (c) electrically coupling the ball at the tip of the conductive wire to each of the electrode pads of the semiconductor chip by applying an ultrasonic wave through guiding by the capillary, (d) sealing the conductive wire and the semiconductor chip with a sealing resin, and (e) cutting/severing the leads projecting from a seal formed by the sealing resin, from the lead frame. The conductive wire includes copper as a principal component. Each of the electrode pads includes aluminum as a principal component. In the step (c), when performing the wire bonding to, among the electrode pads, the electrode pads that are arrayed in a first direction along an application direction of the ultrasonic wave, the ball and each of the electrode pads are coupled to each other while being rubbed against each other in a second direction transverse to the application direction of the ultrasonic wave.

A brief description is given below of advantageous effects attained by representative embodiments of the invention disclosed in the present application.

The risk of an electrical short between the electrode pads of the semiconductor device can be reduced to thereby improve the quality of the semiconductor device.

Also, the reliability of the semiconductor device can be improved.

BRIEF DESCRIPTION OF THE DRAWINGS

FIGS. 23A to 23D are a partial cross-sectional view and a plan view each showing the state of formation of AL splash with respect to the application time of ultrasonic wave in wire bonding according to a comparative example.

DETAILED DESCRIPTION

In the following embodiments, a description of the same or similar parts will not be repeated as a rule unless particularly necessary.

Further, in the following embodiments, the description will be divided into a plurality of sections or embodiments when necessary for the sake of convenience. However, unless explicitly specified otherwise, those sections or embodiments are by no means unrelated to each other, but are in such a relation that one represents a modification, a detailed or supplementary description, etc. of part or whole of the other.

In the following embodiments, when a reference is made to the number etc, (including the number, numeric value, quantity, range, etc.) of elements, except in such cases where it is explicitly specified otherwise or the number is obviously limited to a specific number in principle, the number is not limited to the specific number but may be greater or less than the specific number.

It is needless to mention that, in the following embodiments, their constituent elements (including constituent steps) are not necessarily essential, except in such cases where it is explicitly specified otherwise or they are obviously considered to be essential in principle.

It is needless to mention that, in the following embodiments, when a constituent element or the like is stated as "comprised of A", "having A", or "including A", this does not exclude other elements, except in such cases where it is explicitly specified that the stated element is the sole element. Likewise, in the following embodiments, when a reference is made to the shape, relative position, etc. of a constituent element or the like, this includes those shapes etc. substantially resembling or similar to that shape etc., except in such cases where it is explicitly specified otherwise or it is obviously considered otherwise in principle. The same applies to the numeric value and range mentioned above.

Embodiments of the present invention will be described below in detail with reference to the drawings. Throughout the drawings for explaining the embodiments, members having the same function will be denoted by the same symbols, and their repeated description will be omitted.

Embodiments

Figure 1:
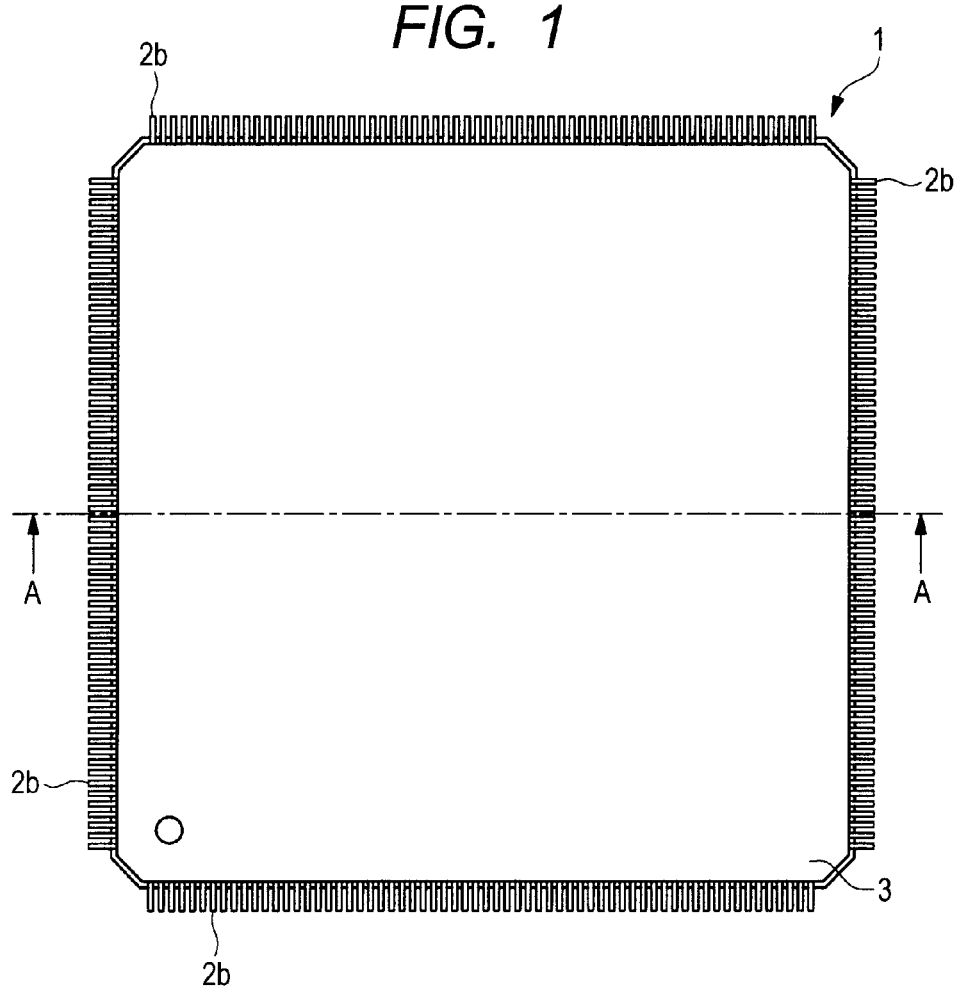
FIG. 1 is a plan view showing an example of the structure of a semiconductor device according to an embodiment of the present invention.
Figure 2:
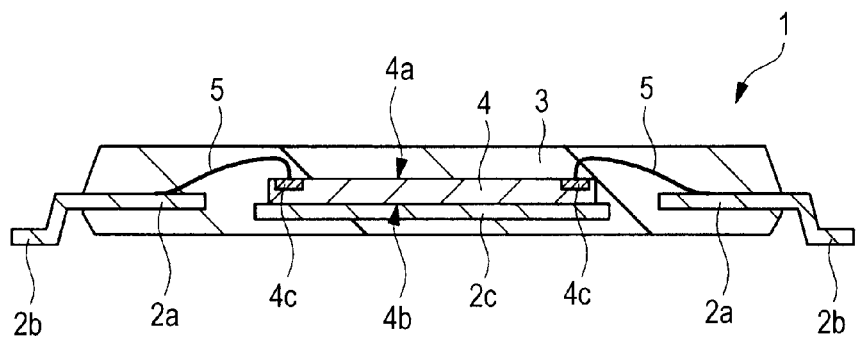
FIG. 2 is a cross-sectional view showing a structure taken along the line A-A shown in FIG. 1.

FIG. 1 is a plan view showing an example of the structure of a semiconductor device according to an embodiment of the present invention. FIG. 2 is a cross-sectional view showing a structure taken along the line A-A shown in FIG. 1.

The semiconductor device according to this embodiment is a multi-pin and resin-seal type semiconductor package that is assembled using a lead frame. In this embodiment, as an example of the above semiconductor device, a multi-pin Quad Flat Package (QFP)1 as shown in FIG. 1 will be described.

The configuration of the QFP 1 shown in FIGS. 1 and 2 will be described. The QFP 1 has a semiconductor chip 4 in which a semiconductor integrated circuit is formed, a plurality of inner leads (leads) 2a arranged radially around the semiconductor chip 4, a plurality of outer leads 2b formed integrally with the inner leads 2a, a plurality of copper wires (conductive wires) 5 that electrically couple a plurality of electrode pads 4c, which are surface electrodes formed in a main surface 4a of the semiconductor chip 4, to the corresponding inner leads 2a.

Further, the QFP 1 has a tab (also called die pad) 2c as a chip mounting part to which the semiconductor chip 4 is fixed via a die bonding material such as a silver paste, and a seal 3 that is formed from sealing resin or the like by resin molding, and seals the semiconductor chip 4, the tab 2c, the plurality of copper wires 5, and the plurality of inner leads 2a. Because the semiconductor device in this embodiment is the QFP 1, the plurality of outer leads 2b formed integrally with the corresponding inner leads 2a project outwards from each of the four sides of the seal 3, and each of the outer leads 2b is bent in a gull-wing shape.

In the semiconductor chip 4 mounted over the QFP 1, the plurality of electrode pads 4c formed in its main surface 4a are provided at a fine pad pitch, thereby creating a multi-pin structure. That is, in the main surface 4a of the semiconductor chip 4, the plurality of electrode pads 4c are arrayed side by side in a square shape around its periphery. Each of the plurality of electrode pads 4c is a surface electrode including aluminum (AL) as a principal component.

The plurality of copper wires 5 that electrically couple the plurality of electrode pads 4c of the semiconductor chip 4 to the corresponding inner leads 2a are copper wires including copper as a principal component. That is, the QFP 1 in this embodiment employs a copper wire (copper wire 5) as a conductive wire, thereby achieving cost reduction. The copper contained in the copper wire 5 is pure copper such as 99.99% copper or 99.999% copper.

Since the semiconductor chip 4 is wire-coupled to each lead, the semiconductor chip 4 is mounted over the tab 2c by face-up placement with its main surface 4a facing up. That is, a back surface 4b of the semiconductor chip 4 and the tab 2c are bonded together via a die bonding material.

The inner lead 2a, the outer lead 2b, and the tab 2c are formed by a thin plate-like member of copper alloy, for example. Further, the seal 3 is comprised of a thermosetting epoxy resin or the like, and is formed by resin molding, for example.

Next, a manufacturing method of the semiconductor device (QFP 1) according to this embodiment will be described with reference to the flow diagram shown in FIG. 3.

Figure 3:
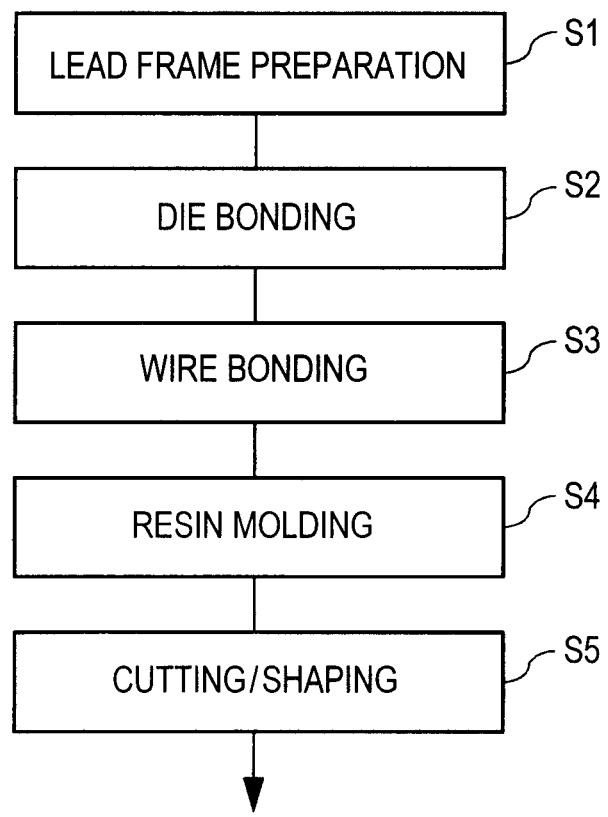
FIG. 3 is a manufacturing flow diagram showing an example of the assembly procedure of the semiconductor device shown in FIG. 1.
Figure 4:
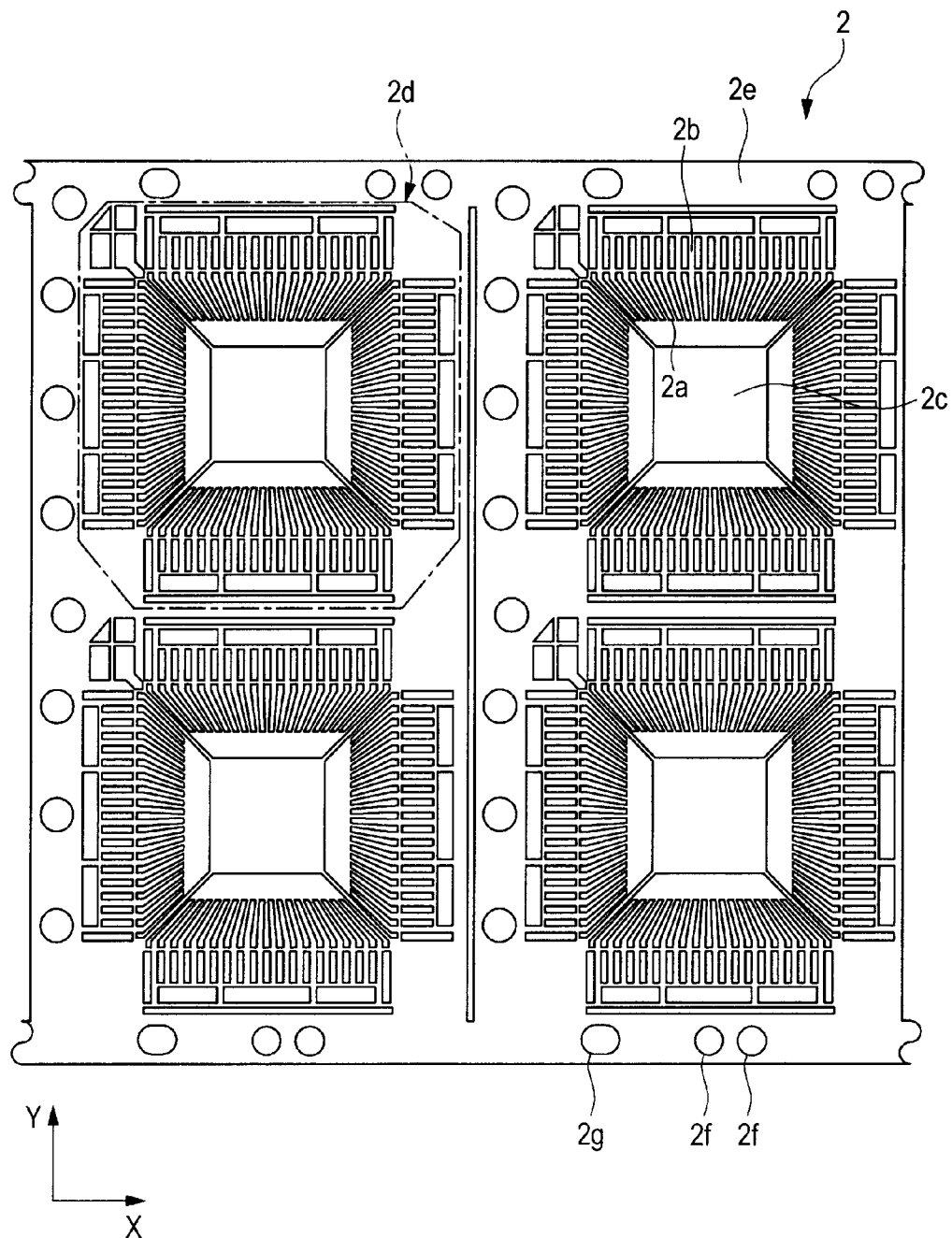
FIG. 4 is an enlarged partial plan view showing an example of the structure of a lead frame used in the assembly of the semiconductor device shown in FIG. 1.
Figure 5:
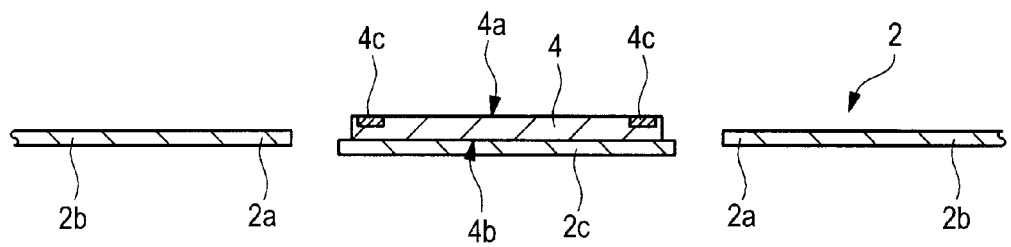
FIG. 5 is a partial cross-sectional view showing an example of structure after die bonding in the assembly of the semiconductor device shown in FIG. 1.
Figure 6:
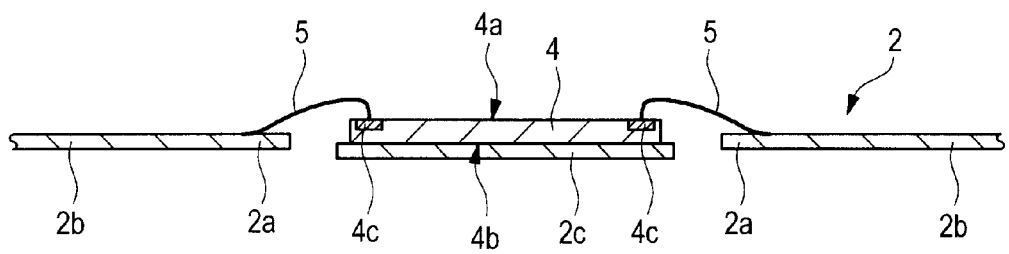
FIG. 6 is a partial cross-sectional view showing an example of structure after wire bonding in the assembly of the semiconductor device shown in FIG. 1.

FIG. 3 is a manufacturing flow diagram showing an example of the assembly procedure of the semiconductor device shown in FIG. 1. FIG. 4 is an enlarged partial plan view showing an example of the structure of a lead frame used in the assembly of the semiconductor device shown in FIG. 1. FIG. 5 is a partial cross-sectional view showing an example of structure after die bonding in the assembly of the semiconductor device shown in FIG. 1. FIG. 6 is a partial cross-sectional view showing an example of structure after wire bonding in the assembly of the semiconductor device shown in FIG. 1.

Figure 7:
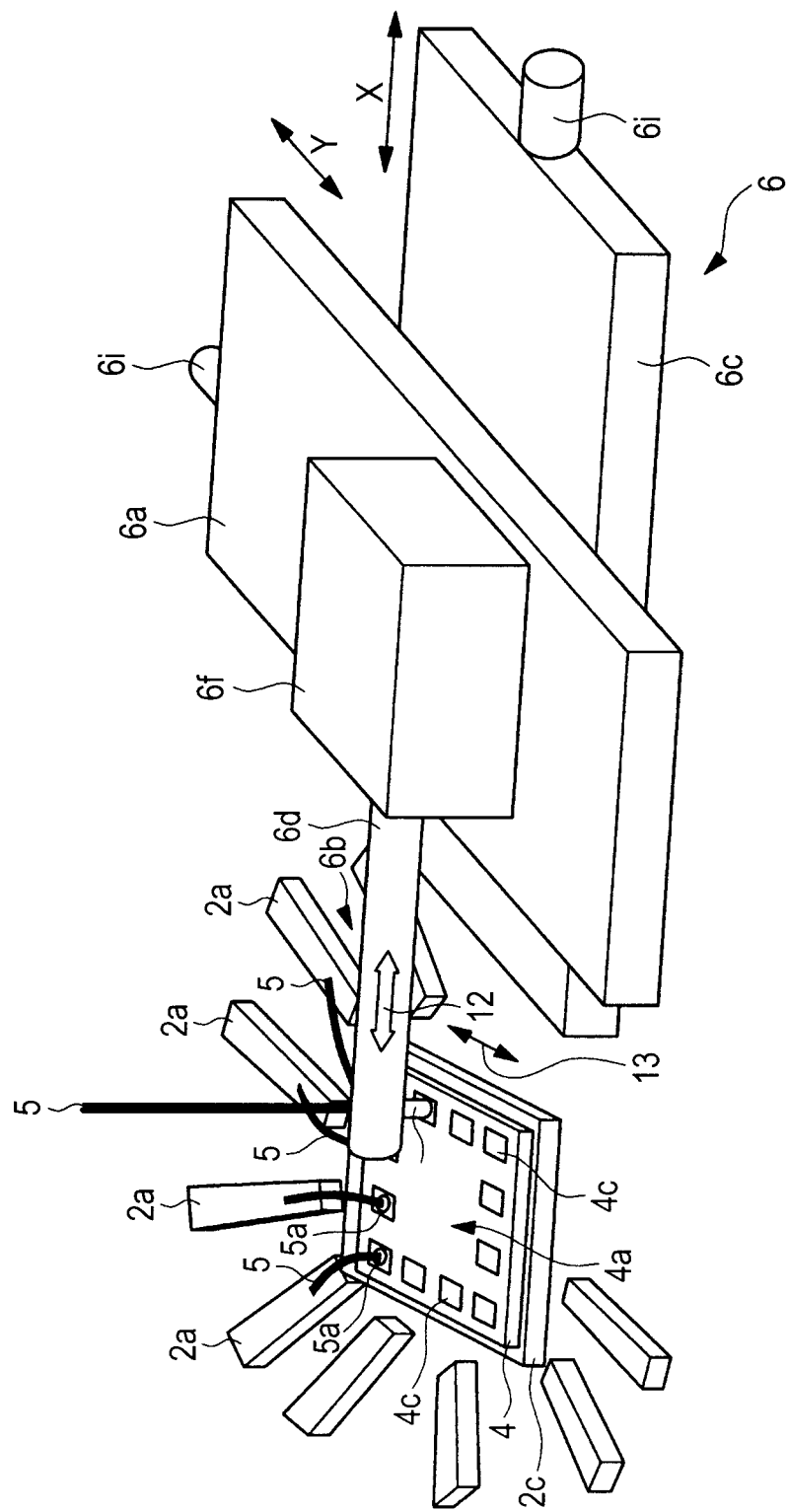
FIG. 7 is a partial perspective view showing an example of the structure of the principal part of a wire bonder, and of wire bonding method used in a wire bonding process in the assembly of the semiconductor device shown in FIG. 1.
Figure 8:
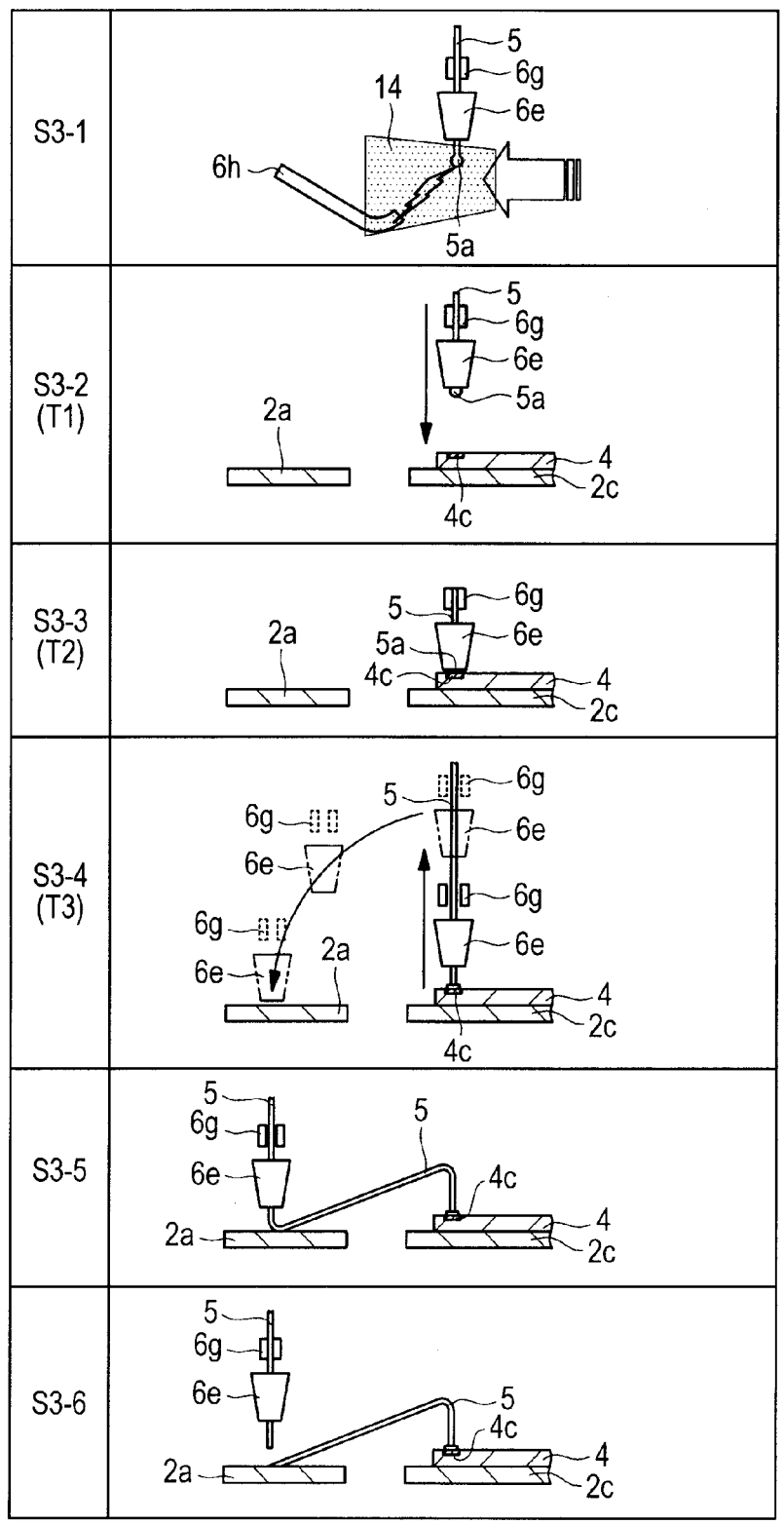
FIG. 8 is a flow diagram showing an example of the procedure of ball bonding using the wire bonder shown in FIG. 7.
Figure 9:
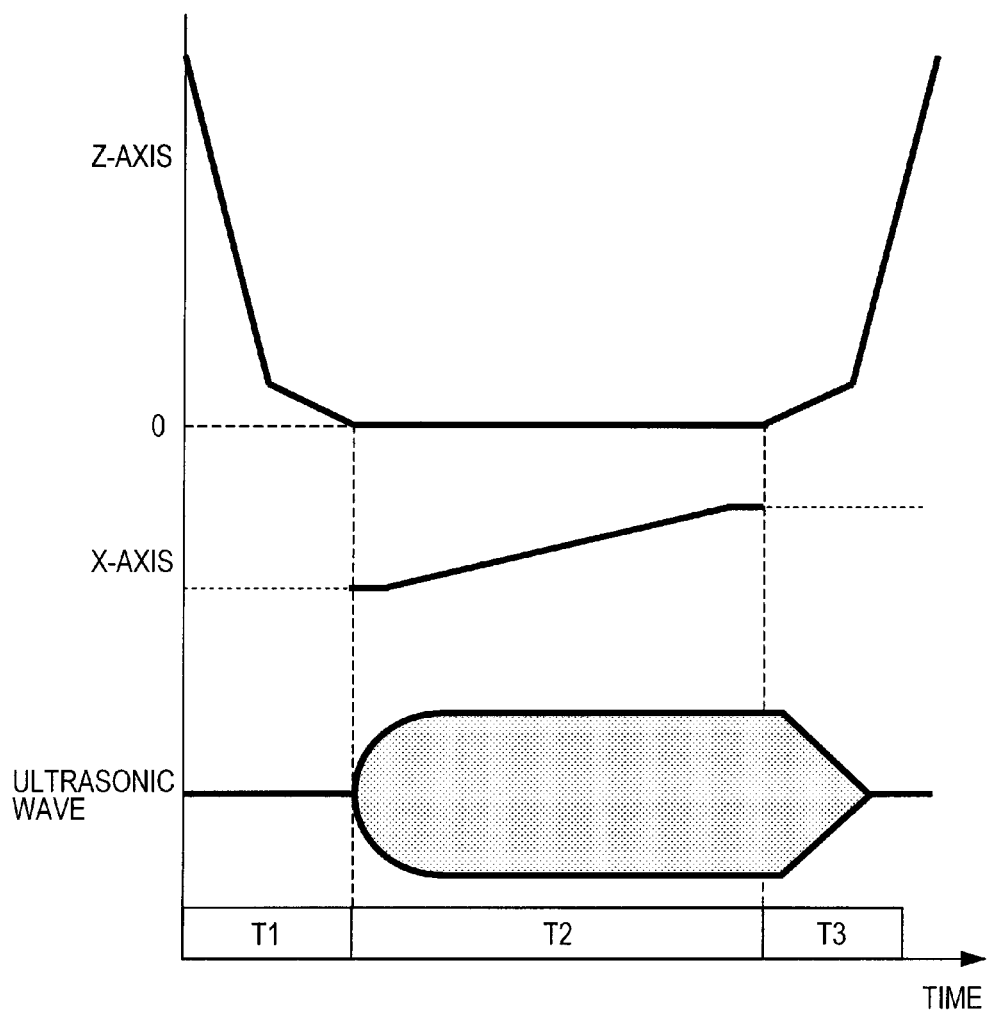
FIG. 9 is a timing chart showing an example of the operation of a bonding head and ultrasonic wave application with respect to time in wire bonding according to an embodiment of the present invention.

FIG. 7 is a partial perspective view showing an example of the structure of the principal part of a wire bonder, and of wire bonding method used in a wire bonding process in the assembly of the semiconductor device shown in FIG. 1, FIG. 8 is a flow diagram showing an example of the procedure of ball bonding using the wire bonder shown in FIG. 7. FIG. 9 is a timing chart showing an example of the operation of a bonding head and ultrasonic wave application with respect to time in wire bonding according to an embodiment of the present invention. FIGS. 10A to 10D are a partial cross-sectional view and a plan view each showing an example of the state of formation of AL splash with respect to the application time of ultrasonic wave in the wire bonding shown in FIG. 9.

Figure 11:
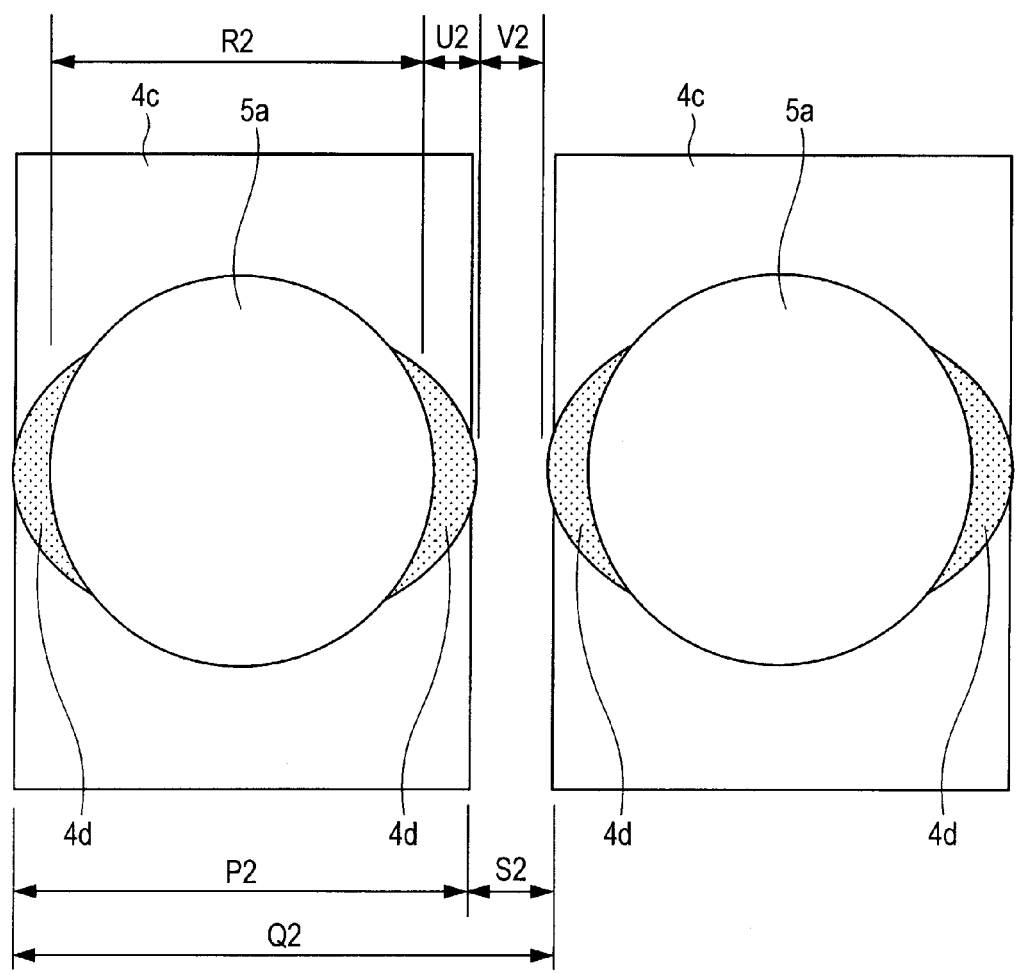
FIG. 11 is a plan view showing the state of formation of AL splash in a fine pad pitch product according to the wire bonding shown in FIG. 9.
Figure 12:
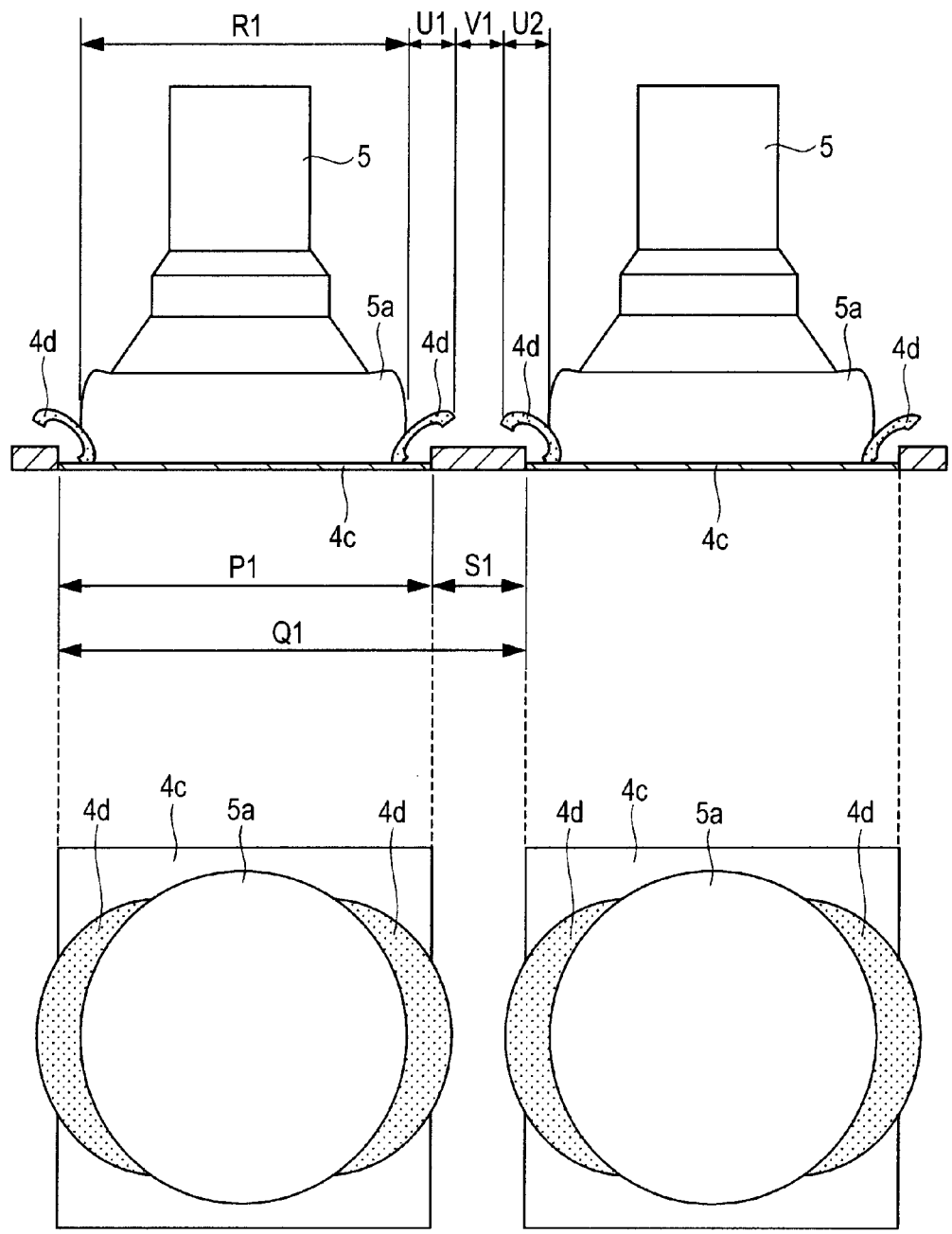
FIG. 12 are a plan view and a partial cross-sectional, view each showing the state of formation of AL splash when typical ball bonding is performed for a non-fine pad pitch product.
Figure 13:
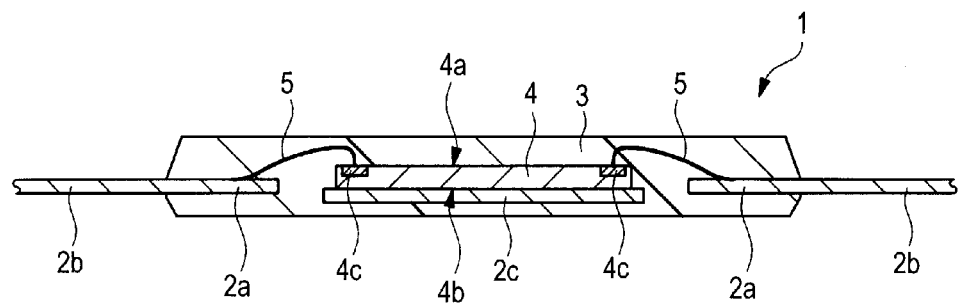
FIG. 13 is a partial cross-sectional view showing an example of structure after resin molding in the assembly of the semiconductor device shown in FIG. 1.
Figure 14:
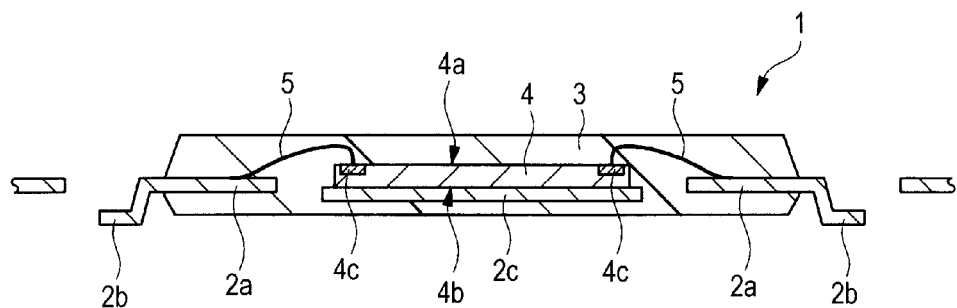
FIG. 14 is a partial cross-sectional view showing an example of structure after cutting/shaping in the assembly of the semiconductor device shown in FIG. 1.

FIG. 11 is a plan view showing the state of formation of AL splash in a fine pad pitch product according to the wire bonding shown in FIG. 9. FIG. 12 are a plan view and a partial cross-sectional view each showing the state of formation of AL splash when typical ball bonding is performed for a non-fine pad pitch product. FIG. 13 is a partial cross-sectional view showing an example of structure after resin molding in the assembly of the semiconductor device shown in FIG. 1. FIG. 14 is a partial cross-sectional view showing an example of structure after cutting/shaping in the assembly of the semiconductor device shown in FIG. 1.

First, lead frame preparation shown in step S1 of FIG. 3 is performed. In this case, a matrix frame 2 as an example of lead frame shown in FIG. 4 is prepared. In the matrix frame 2, a plurality of device areas 2d over each of which the semiconductor chip 4 is mounted are formed side by side, and the plurality of inner leads (leads) 2a and outer leads (leads) 2b are provided in each of the device areas 2d.

The matrix frame 2 shown in FIG. 4 used in this embodiment is a multiple thin plate member in which the plurality of device areas 2d each serving an area for forming the single QFP 1 are formed in a matrix arrangement in a plurality of rows by a plurality of columns (for example, two rows by two columns in FIG. 4). In each of the device areas 2d, the single tab (die pad) 2c, the plurality of inner leads 2a and outer leads 2d, and the like are formed.

The matrix frame 2 is, for example, a thin plate member having the shape of a rectangle formed by a copper alloy or the like, in which the tab 2c, and the plurality of inner leads 2a and the outer leads 2d are formed integrally. In the matrix frame 2 shown in FIG. 4, the X-direction indicates the lengthwise direction of the rectangle, and the Y-direction indicates the widthwise direction of the rectangle.

In a frame part 2e at either end along the widthwise direction of the matrix frame 2, a plurality of long holes 2g for positioning and a plurality of sprocket holes 2f for guiding which are used at the time of processing are provided.

Although the number of the inner leads 2a in each single device area 2d of the matrix frame 2 shown in FIG. 4 differs from the number of the outer leads 2d in the QFP 1 shown in FIG. 1, this is to facilitate understanding of the shape of the lead portion of the matrix frame 2. It is needless to mention that the number of the inner leads 2a in each single device area 2d of the matrix frame 2 used for assembling the QFP 1 is the same as the number of the outer leads 2b in the QFP 1.

Thereafter, die bonding shown in step S2 of FIG. 3 is performed. In this case, the semiconductor chip 4 is mounted over the tab (chip mounting part) 2c in each of the plurality of device areas 2d of the matrix frame 2 via a die bonding material as shown in FIG. 5. That is, the back surface 4b of the semiconductor chip 4 and the tab 2c are bonded together by the die bonding material.

In the main surface 4a of the semiconductor chip 4, the plurality of electrode pads 4c are arranged side by side around its periphery as shown in FIG. 7.

Thereafter, wire bonding shown in step S3 of FIG. 3 is performed. That is, as shown in FIG. 6, the electrode pad 4c in the main surface 4a of the semiconductor chip 4, and the corresponding inner lead 2a are electrically coupled to each other by the copper wire (conductive wire) 5 through guiding by the capillary 6e as a bonding tool as shown in FIG. 7. The copper wire 5 is a copper wire including copper as a principal component.

Now, the wire bonder 6 shown in FIG. 7 used in the wire bonding process of step S3 will be described.

The wire bonder 6 includes, as its principal part, a Z-axis head 6f having a bonding head 6b that performs wire bonding, an X-axis stage 6a that moves the Z-axis head 6f in the X-direction, a Y-axis stage 6c that moves the Z-axis head 6f in the Y-direction, and a motor 6i that drives the X-axis stage 6a and the Y-axis stage 6c.

Further, the bonding head 6b is provided with the capillary 6e that guides the copper wire 5 during wire bonding, an ultrasonic horn 6d that applies ultrasonic wave to the copper wire 5 via the capillary 6e, a clamper 6g shown in FIG. 8 that clamps the copper wire 5 when cutting the copper wire 5, and the like.

The ultrasonic wave application direction (ultrasonic vibration direction) 12 by the ultrasonic horn 6d is a first direction along the direction in which the ultrasonic horn 6d extends, and a direction along the X-direction.

Now, referring to FIGS. 8 and 9, the procedure of wire bonding in the assembly of the QFP 1 according to this embodiment will be described. The wire bonding described in this embodiment is bail bonding.

First, bail formation shown in step S3-1 of FIG. 8 is performed. In this case, the tip of the copper wire 5 guided by the capillary 6e is subjected to arc discharge with a torch 6h, thereby forming a ball 5a. At that time, since the copper wire 5 is used, arc discharge is performed in an atmosphere of a N2+H2 gas 14 to prevent oxidation of the ball 5a.

Thereafter, the first bond (chip side) shown in steps S3-2 and S3-3 is performed. In this case, the ball 5a at the tip of the copper wire 5 is electrically coupled to the electrode pad 4c of the semiconductor chip 4 through guiding by the capillary 6e by application of ultrasonic wave/heat/load.

First, a description will be given of the case of performing wire bonding to the plurality of electrode pads 4c that are arrayed in a first direction along the ultrasonic wave application direction (ultrasonic vibration direction) 12, among the plurality of electrode pads 4c provided around the periphery of the main surface 4a of the semiconductor chip 4 shown in FIG. 7.

Figure 10:
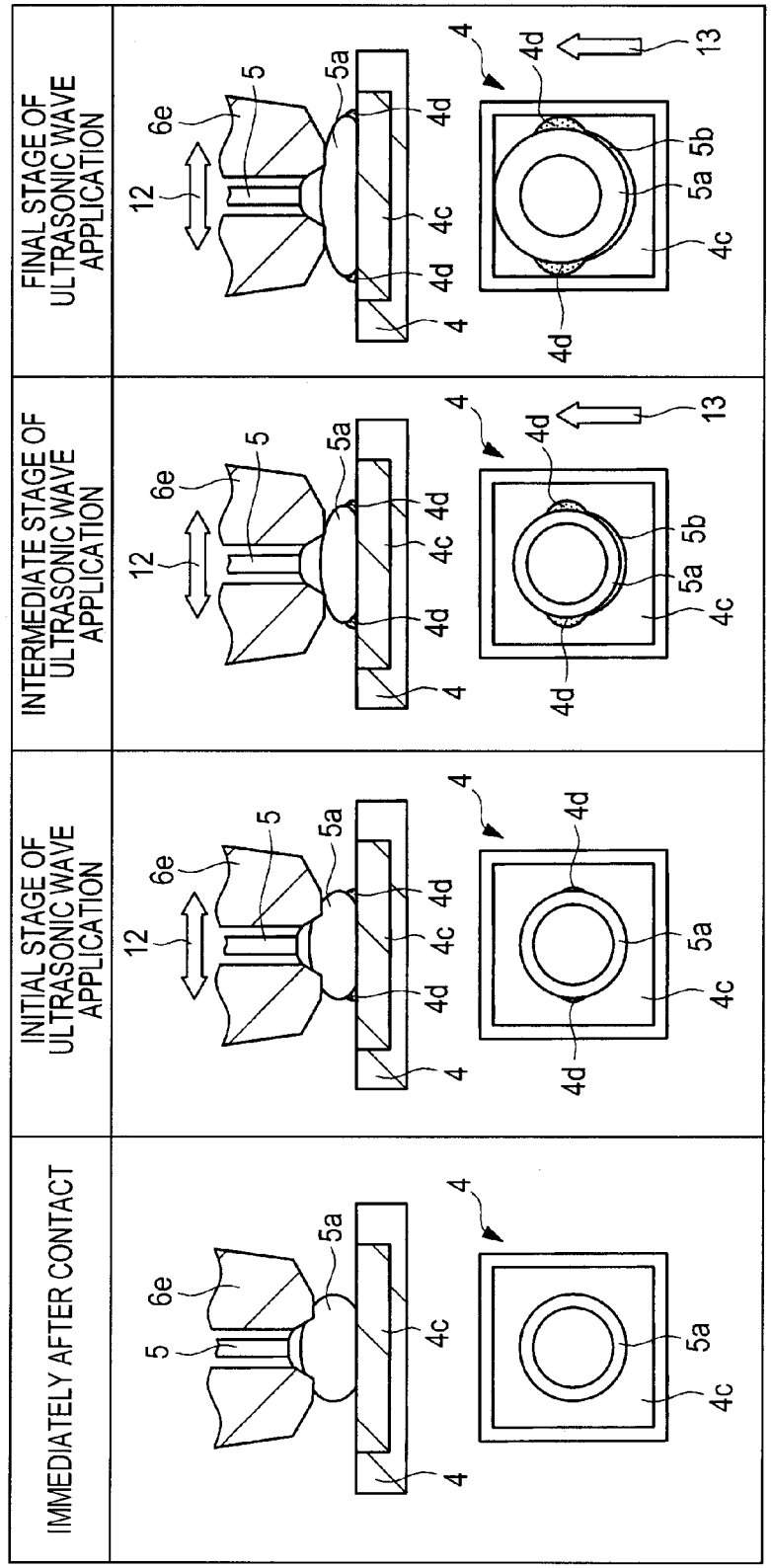
FIGS. 10A to 10D are a partial cross-sectional view and a plan view each showing an example of the state of formation of AL splash with respect to the application time of ultrasonic wave in the wire bonding shown in FIG. 9.

At that time, as shown in S3-2 of FIG. 8, the copper wire 5 is lowered through guiding by the capillary 6e (time T1 in FIG. 9), and as indicated by the landing point (point 0) of the Z-axis (capillary 6e) in FIG. 9 and the stage A immediately after contact in FIG. 10A, the ball 5a at the tip of the copper wire 5 is brought into contact with the electrode pad 4c by applying heat/load. Thereafter, application of ultrasonic wave is stalled as shown in S3-3 of FIG. 8 and time T2 in FIG. 9. Upon starting the application of ultrasonic wave, as indicated by the initial stage B of ultrasonic wave application in FIG. 10B, a small AL splash 4d begins to be formed on either side of the ball 5a.

Accordingly, in wire bonding according to this embodiment, the movement in the Y-direction of the bonding head 6b shown in FIG. 7 (movement of the X-axis in FIG. 9) is started with a slight delay after the application of ultrasonic wave. The Y-direction mentioned above is a second direction 13 which is transverse to the ultrasonic wave application direction 12. At that time, the Y-axis stage 6c is moved by the motor 6i to move the bonding head 6b in the Y-direction, thereby performing wire bonding while rubbing the ball 5a and the electrode pad 4c against each other in the second direction 13. As seen in the figures, the first direction 12 and the second direction 13 are perpendicular to one another as viewed along the Z-axis, as are the X-direction and the Y-direction.

The movement of the bonding head 6b in the second direction 13 intersecting the ultrasonic wave application direction 12 is performed during the entire time while the Z-axis (capillary 6e) is landing (point 0) (time T2) as shown in FIG. 9. At this time, it is preferable to stop the movement slightly before stopping the application of ultrasonic wave, and the amount of movement of the bonding head 6b in the second direction 13 is, for example, 5 µm. Also, as the movement of the X-axis in FIG. 9 (movement of the bonding head 6b in the Y-direction), a case in which the bonding head 6b is moved in a single direction over time T2 is illustrated.

Therefore, in the intermediate stage C of ultrasonic wave application or the final stage D of ultrasonic wave application in FIGS. 10C and 10D, as shown in each corresponding plan view, the ball 5a is coupled to the electrode pad 4c while leaving a ball mark 5b along the second direction 13.

Thus, in the final stage D of ultrasonic wave application as well, it is possible to suppress growth of the AL splash 4d and make the amount of formation of AL splash 4d small.

In the ball bonding according to this embodiment, as shown in FIG. 11, the length (U2) of the AL splash 4d can be limited to about 5 µm.

The above completes the first bond (chip side). That is, as shown in time T3 in FIG. 9, movement of the X-axis (movement of the bonding head 6b in the Y-direction) and application of ultrasonic wave are stopped, and then the Z-axis (capillary 6e) is raised, At this time, as shown in S3-4 of FIG. 8, the clamper 6g is opened to pay out the copper wire 5 necessary for making a loop, and after closing the clamper 6g, a wire loop is formed toward the second bond point (inner lead 2a).

Thereafter, as shown in S3-5 of FIG. 8, a stitch bond is made to the second bond point (inner lead 2a), the copper wire 5 necessary for ball formation is paid out, and further, as shown in S3-6, the clamper 6g is closed and the capillary 6e is raised, thereby cutting the copper wire 5.

In this way, wire bonding is sequentially performed, completing the wire bonding process shown in step S3 of FIG. 3.

When performing wire bonding to the plurality of electrode pads 4c that are arrayed along the second direction 13 (Y-direction), among the plurality of electrode pads 4c provided around the periphery of the main surface 4a of the semiconductor chip 4 shown in FIG. 7, ball bonding is performed by applying only ultrasonic wave, heat, and load, without moving the bonding head 6b in the second direction 13 (Y-direction).

Now, with reference to FIGS. 11 and 12, a description will be given of the amount of formation of the AL splash 4d in a case where bail bonding according to this embodiment is performed for a fine pad pitch product, and in a case where typical ball bonding is performed for a non-fine pad pitch product.

First, FIG. 12 show the state of formation of the AL splash 4d when typical ball bonding is performed for a non-fine pad pitch product. As the conditions of wire bonding, assuming that the wire diameter=$\phi$30 μm, the pad pitch (Q1)=100 μm, the pad opening (P1)=80 μm, the inter-pad gap (S1)=20 μm, the compression-bonded bail diameter (R1)=100 μm, and the bonding position is the pad center, the AL, splash length (U1)=10 μm, and the AL splash separation between adjacent pads (V1)=10 μm. In this case, an electrical short due to the AL splash 4d can be prevented even when variations in bonding accuracy of wire bonding are taken into account.

On the other hand, FIG. 11 shows the state of formation of the AL splash 4d when ball bonding according to this embodiment is performed for a fine pad pitch product. As the conditions of wire bonding, assuming that the wire diameter=$\phi$20 μm, the pad pitch (Q2)=60 μm, the pad opening (P2)=51 μm, the inter-pad gap (S2)=9 μm, the compression-bonded ball diameter (R2)=44 μm, and the bonding position is the pad center, the AL splash length (U2)=5 μm, and the AL splash separation between adjacent pads (V2)=8 μm. In this case as well, an electrical short due to the AL splash 4d can be prevented even when variations in bonding accuracy of wire bonding are taken into account.

That is, by employing the ball bonding according to this embodiment, an electrical short due to the AL splash 4d can be prevented even for a semiconductor device that is the fine pad pitch product as shown in FIG. 11.

After completion of the wire bonding process, resin molding shown in step S4 of FIG. 3 is performed. In this case, using a resin molding die (not shown), the tab 2c, the semiconductor chip 4, and the plurality of inner leads 2a and copper wires 5 in the device area 2d of the matrix frame 2 shown in FIG. 4 are resin-sealed using a sealing resin, forming the seal 3. The above-mentioned sealing resin is, for example, a thermosetting epoxy resin.

Thereafter, cutting/shaping shown in step S5 of FIG. 3 is performed. In this case, the matrix frame 2 is cut into discrete individual packages. At that time, as shown in FIG. 14, each of the plurality of outer leads (leads) 2b projecting from the seal 3 is cut/severed from the matrix frame 2, and is further bent in a gull-wing shape, thereby completing the assembly of the QFP 1.

According to the manufacturing method of a semiconductor device in this embodiment, in each of the electrode pads 4c of the semiconductor chip 4 which are arrayed along the ultrasonic wave application direction (ultrasonic vibration direction 12), the bail 5a at the tip of the copper wire 5 and the electrode pad 4c are coupled to each other while being rubbed against each other in the second direction 13. Thus, the amount of formation of the AL splash 4d on the electrode pad 4c can be minimized. That is, the size of the AL splash 4d can be made smaller.

For example, assuming that the wire diameter of the copper wire 5 is $\phi$20 μm, the pad pitch=60 μm, and the pad opening is 51 μm, the size of the AL splash 4d can be made as small as about 5 μm, which is about half of that in related art.

Thus, the margin for electrical short due to the AL splash 4d between adjacent pads can be increased, thereby reducing the risk of electrical short. In other words, it is possible to prevent the AL splash 4d from spreading in one direction, thereby increasing the margin for electrical short between adjacent pads.

This feature proves very advantageous particularly for a semiconductor device that is a fine pad pitch product with a fine pitch between the electrode pads 4c.

As a result, the quality of the QFP 1 (semiconductor device) assembled by the ball bonding according to this embodiment can be improved.

Further, reliability of the QFP 1 mentioned above can be improved.

That is, it is possible to reduce the risk of electrical short between adjacent pads to minimize a reduction in process margin due to electrical short. As a result, the quality and reliability of the QFP 1 mentioned above can be improved.

This feature proves very advantageous particularly in applying the copper wire 5 to a fine pad pitch product with a fine pitch between adjacent pads as described above.

Moreover, when performing ball bonding to each of the electrode pads 4c of the semiconductor chip 4 which are arrayed along the ultrasonic wave application direction 12, when rubbing the ball 5a at the tip of the copper wire 5 and the electrode pad 4c against each other in the second direction 13, the bonding head side is moved in the second direction 13. Thus, the cumulative value of various errors in wire bonding can be minimized.

That is, while the bonding head side is vibrated with application of ultrasonic wave in the first place, the chip side (stage side) undergoes relatively few operations in comparison to the bonding head side. Therefore, considering the cumulative value of errors in various operations during ball bonding, when rubbing the ball 5a of the copper wire 5 and the electrode pad 4c against each other in the above-mentioned transverse second direction 13, the cumulative value of errors mentioned above can be minimized further by moving the bonding head side than by moving the chip side.

Next, modifications of this embodiment will be described.

Figure 15:
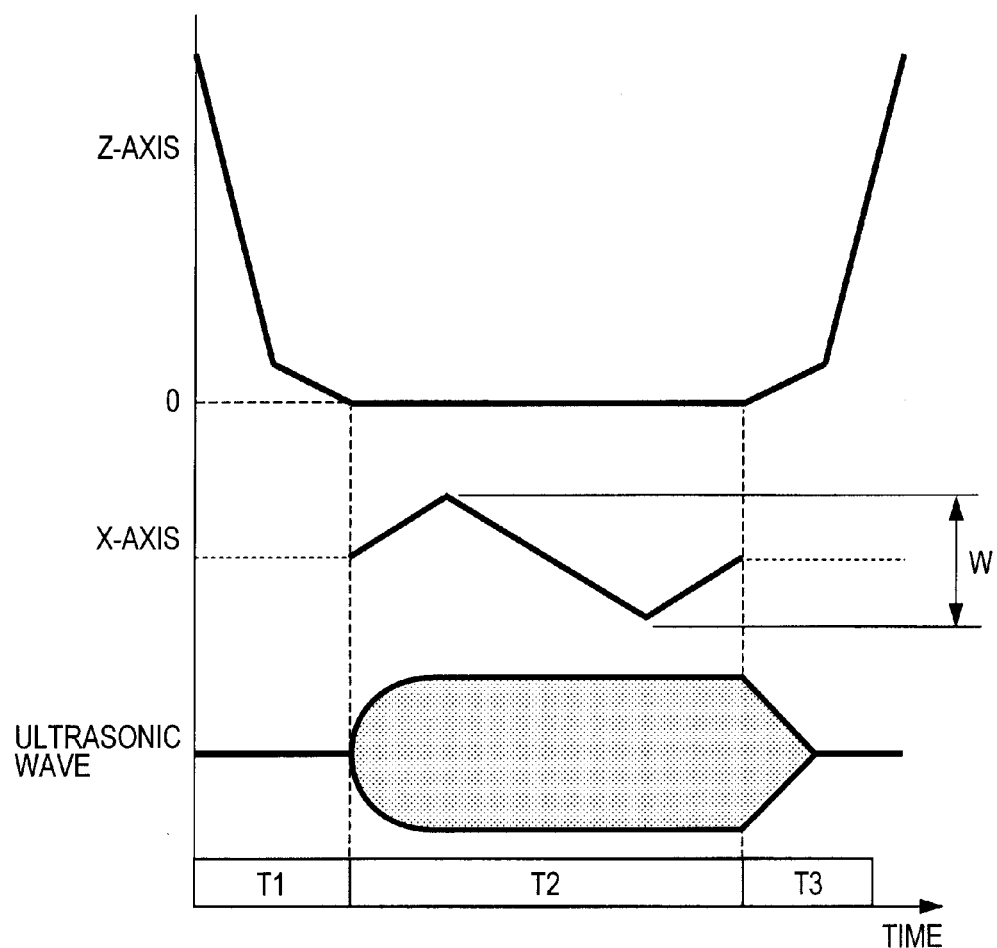
FIG. 15 is a timing chart showing the operation of a bonding head and ultrasonic wave application with respect to time in wire bonding according to a first modification of the present invention.
Figure 16:
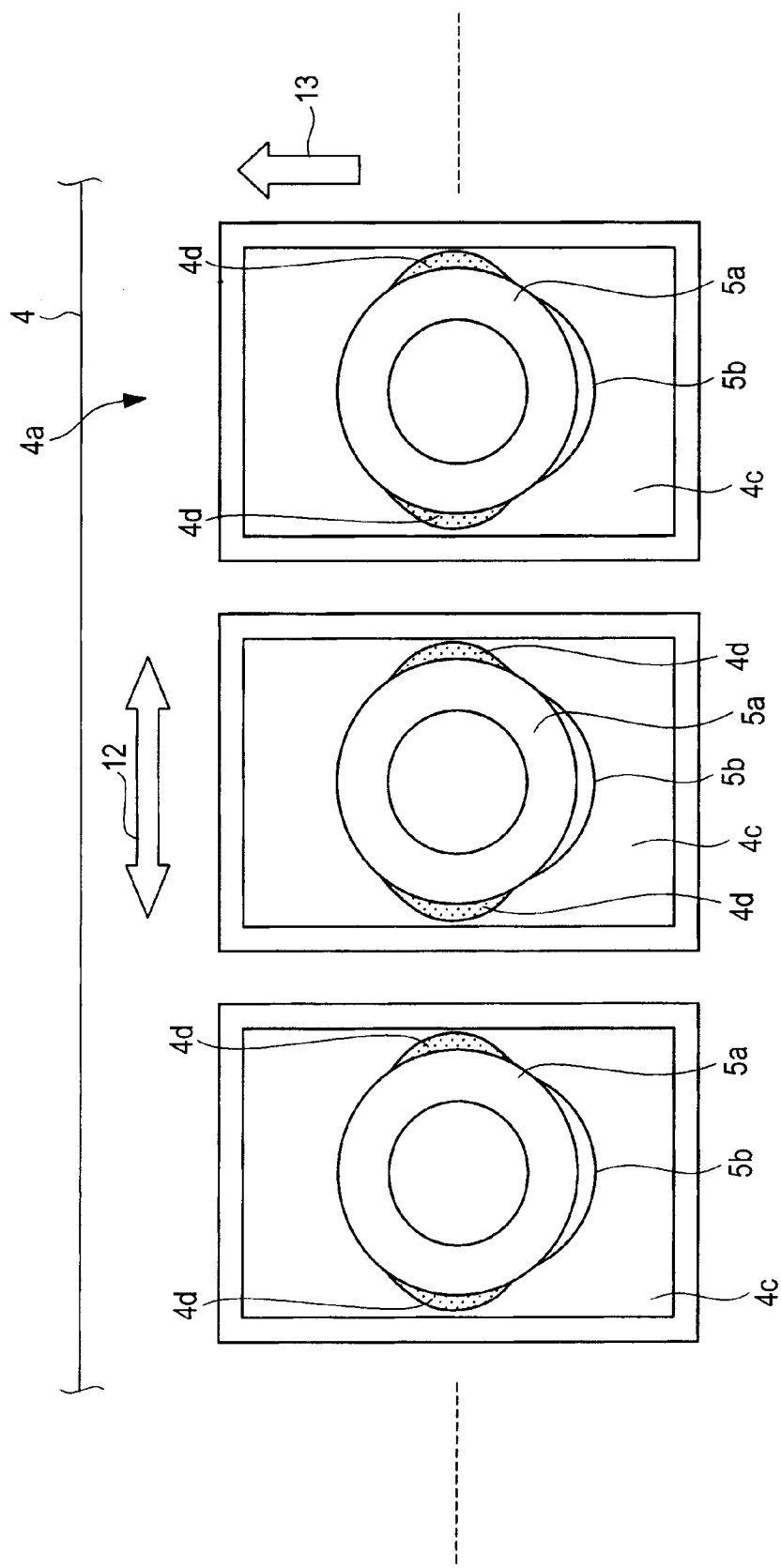
FIG. 16 is a plan view showing a pad shape according to a second modification of the present invention.
Figure 17:
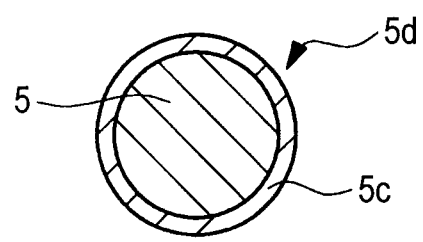
FIG. 17 is a cross-sectional view showing the structure of a conductive wire according to a third modification of the present invention.
Figure 18:
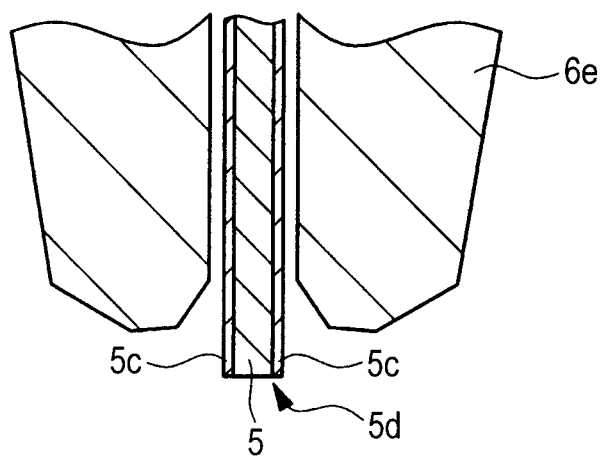
FIG. 18 is a partial cross-sectional view showing a state before ball formation in ball bonding using the conductive wire shown in FIG. 17.
Figure 19:
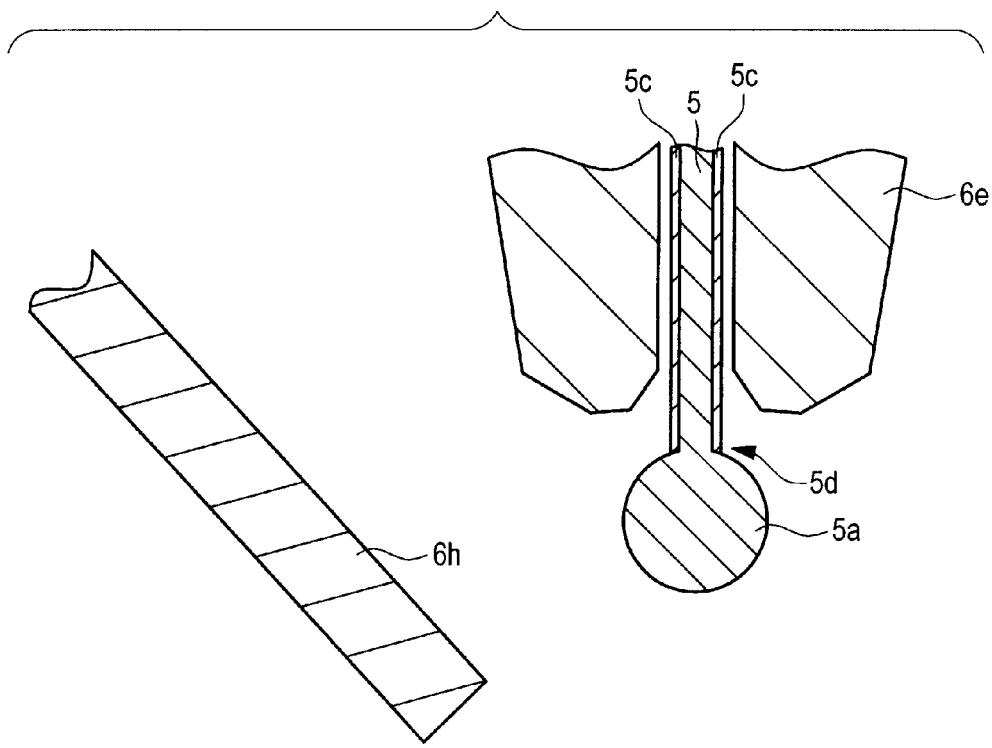
FIG. 19 is a partial cross-sectional view showing a state after ball formation in ball bonding using the conductive wire shown in FIG. 17.
Figure 20:
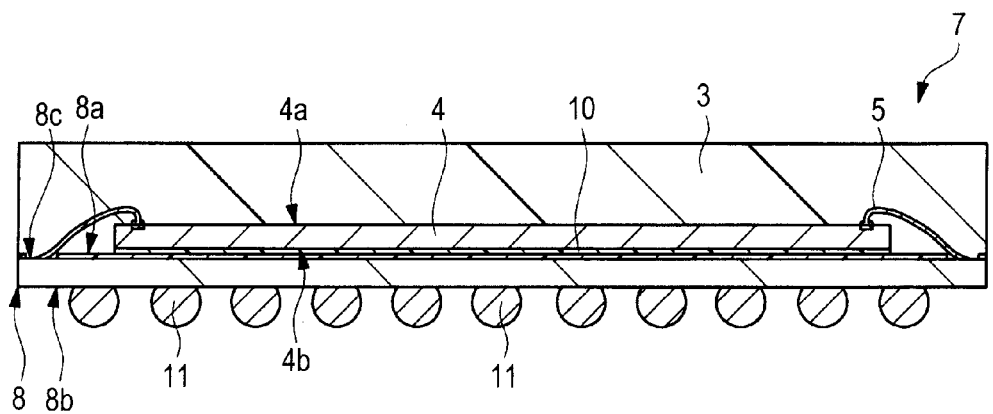
FIG. 20 is a cross-sectional view showing an example of the structure of a semiconductor device (BGA) according to a fourth modification of the present invention.
Figure 21:
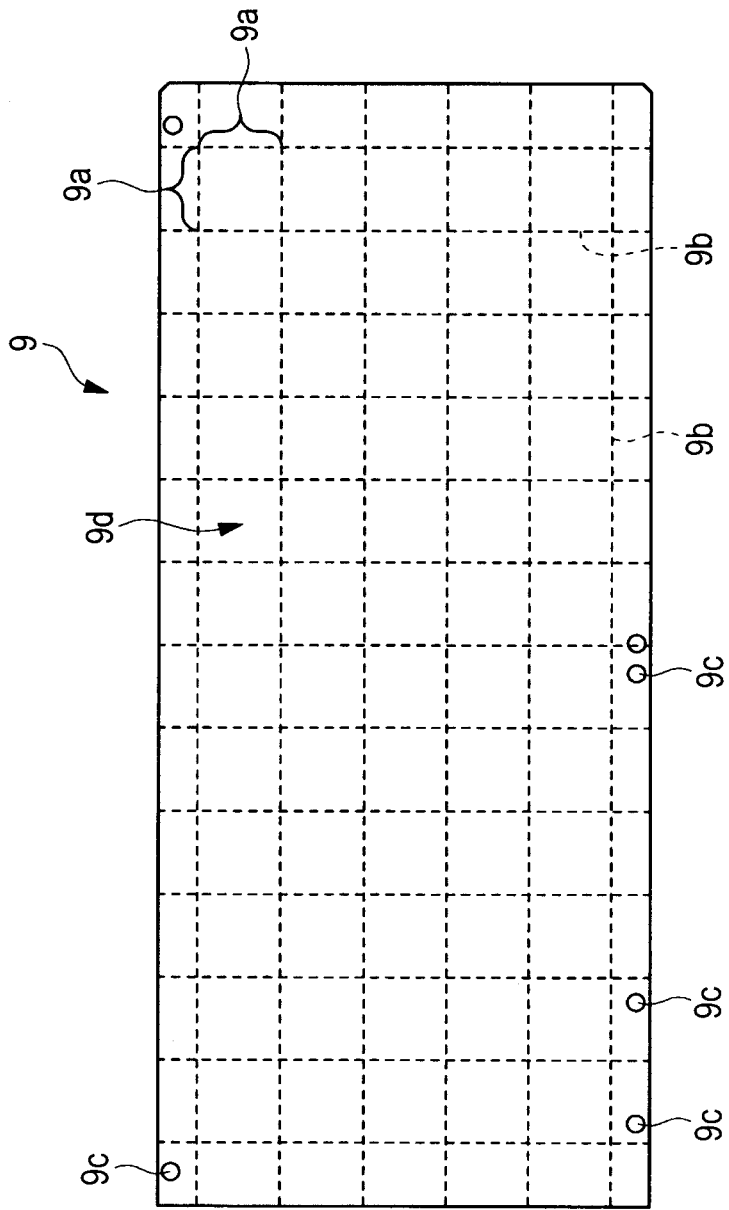
FIG. 21 is a plan view showing an example of the structure of a wiring board used in the assembly of the semiconductor device shown in FIG. 20.
Figure 22:
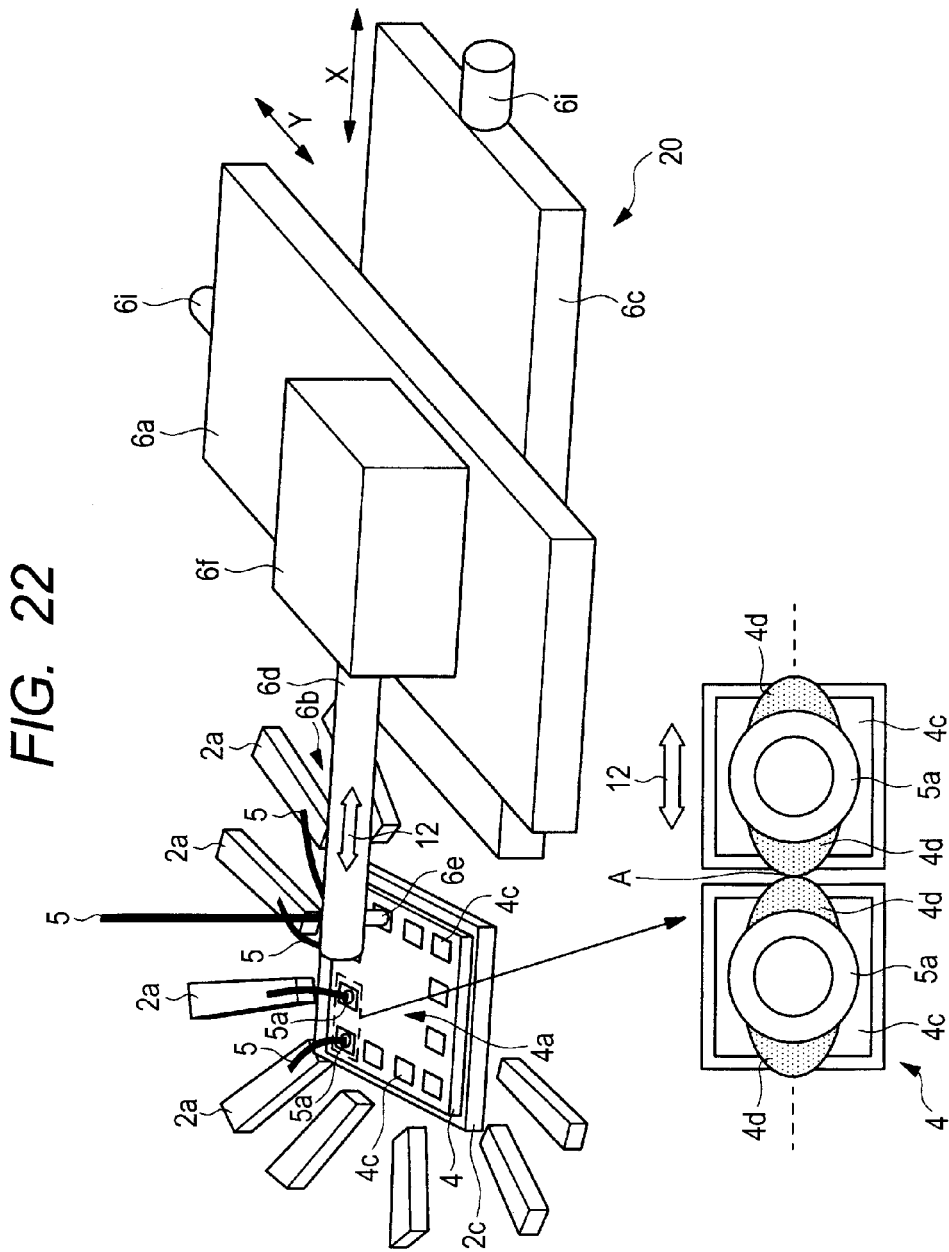
FIG. 22 are a partial perspective view and a plan view showing the structure of the principal part of a wire bonder used in wire bonding according to a comparative example, and the state of formation of AL splash, respectively.

FIG. 15 is a timing chart showing the operation of a bonding head and ultrasonic wave application with respect to time in wire bonding according to a first modification of the present invention. FIG. 16 is a plan view showing a pad shape according to a second modification of the present invention. FIG. 17 is a cross-sectional view showing the structure of a conductive wire according to a third modification of the present invention. FIG. 18 is a partial cross-sectional view showing a state before ball formation in ball bonding using the conductive wire shown in FIG. 17. Further, FIG. 19 is a partial cross-sectional view showing a state after ball formation in ball bonding using the conductive wire shown in FIG. 17. FIG. 20 is a cross-sectional view showing an example of the structure of a semiconductor device (BGA) according to a fourth modification of the present invention. FIG. 21 is a plan view showing an example of the structure of a wiring board used in the assembly of the semiconductor device shown in FIG. 20.

First, the first modification shown in FIG. 15 illustrates a case in which during movement (movement in the Y-direction) of the bonding head 6b shown in FIG. 7 in the second direction 13 transverse to the ultrasonic wave application direction 12, the bonding head 6b is reciprocated with respect to the Y-direction.

For example, the bonding head 6b is moved by 5 μm each way and 10 μm both ways (W). Reciprocating the bonding head 6b (i.e., moving the bonding head 6b in both directions) with respect to the Y-direction in this way can prevent the AL splash 4d from being formed unevenly in one direction.

Next, the second modification shown in FIG. 16 illustrates a case in which, among the plurality of electrode pads 4c in the main surface 4a of the semiconductor chip 4, at least the plurality of electrode pads 4c that are arrayed along the ultrasonic wave application direction (ultrasonic vibration direction) 12 have a rectangular shape with a long dimension extending along the second direction 13. Thus, these electrode pads are formed in a rectangle having a longitudinal direction along the second direction 13 which is transverse to the ultrasonic wave application direction 12.

That is, in a case where the plurality of electrode pads 4c are arranged side by side in a direction along the ultrasonic wave application direction (ultrasonic vibration direction) 12 in the semiconductor chip 4, the electrode pads 4c are formed in an oblong shape (rectangle) having a long dimension extending along the second direction 13, and so have a longitudinal direction along the second direction 13 which is transverse to the ultrasonic wave application direction 12.

Thus, even in the case where, during ball bonding, the AL splash 4d is formed in the second direction 13 upon moving the bonding head 6b shown in FIG. 7 in the second direction 13, since the electrode pads 4c are formed so as to be elongated in the second direction 13 as shown in FIG. 16, it is possible to prevent the AL splash 4d from projecting from the pad opening, thereby improving the margin for defects due to the AL splash 4d.

As a result, the quality and reliability of the QFP (semiconductor device) 1 can be improved.

Next, the third modification shown in FIGS. 17 to 19 employs, as a conductive wire, a Pd-plated copper wire 5d whose surface is coated with a palladium (Pd) plating 5c.

That is, the Pd-plated copper wire 5d is a conductive wire obtained by coating the outer surface of the copper wire 5 with the palladium plating 5c as shown in FIG. 17. The Pd-plated copper wire 5d has enhanced oxidation resistance for the purpose of preventing oxidation of the copper wire 5.

Bail boning using the Pd-plated copper wire 5d can be performed by the same procedure as that of the ball bonding according to this embodiment. Arc discharge is produce between the tip of the Pd-plated copper wire 5d projecting from the tip of the capillary 6e as shown in FIG. 18, and the torch 6h as shown in FIG. 19, thereby forming the ball 5a.

Since palladium melts to the inside of copper upon forming the ball 5a by arc discharge at the tip of the Pd-plated copper wire 5d, copper is exposed through the surface of the bail 5a formed.

The procedure of ball bonding after the ball formation is the same as the procedure shown in FIG. 8. Therefore, also in the case of performing the ball bonding according to this embodiment by using the Pd-plated copper wire 5d, in each of the semiconductor pads 4c of the semiconductor chip 4 which are arrayed along the ultrasonic wave application direction (ultrasonic vibration direction) 12 shown in FIG. 7, the ball 5a at the tip of the Pd-plated wire 5d and the electrode pad 4c are coupled to each other while being rubbed against each other in the second direction 13. Thus, the amount of formation of the AL splash 4d can be minimized, thereby making the size of the AL splash 4d smaller.

As a result, in the case of using the Pd-plated copper wire 5d as well, the quality and reliability of the QFP (semiconductor device) 1 can be improved as in the case of using the copper wire 5.

Next, the fourth modification shown in FIGS. 20 and 21 represents a case in which the semiconductor device to be assembled by the ball bonding according to this embodiment is a board-type Ball Grid Array (BGA) 7, illustrating the structure of the BGA 7, and the structure of a multi-cavity board 9 used in the assembly process including bail bonding.

The BGA 7 shown in FIG. 20 has the semiconductor chip 4 mounted over a main surface 8a of a BGA board 8 via a die bonding material such as a resin paste material 10. Surface electrodes of the semiconductor chip 4 and bonding leads 8c in the main surface 8a of the BGA board 8 are electrically coupled to each other via the plurality of copper wires 5, Further, the semiconductor chip 4 and the plurality of copper wires 5 are resin-sealed with the seal 3 comprised of a sealing resin over the main surface 8a of the BGA board 8.

On a back 8b side of the BGA board 8, a plurality of solder balls 11 serving as external coupling terminals are provided while being arranged side by side in a grid.

FIG. 21 shows the structure of the multi-cavity board 9 used in the assembly of the BGA 7. In a main surface 9d of the multi-cavity board 9, a plurality of device areas 9a from each of which the single BGA 7 can be assembled are formed in a matrix array. Each of the device areas 9a is defined by dicing lines 9b. Also, around the periphery of the main surface 9a of the multi-cavity board 9, there are formed a plurality of through-holes 9c used for the purpose of positioning or guiding during transport of the board or the like.

The BGA 7 is assembled by performing the bail bonding according to this embodiment by using the multi-cavity board 9 mentioned above, and also by using a conductive wire such as the copper wire 5 or the Pd-plated copper wire 5d. Thus, as in the case of the QFP 1, the amount of formation of the AL splash 4d during bail bonding can be minimized, thereby making the AL splash 4d smaller.

As a result, as in the case of the QFP 1, the quality and reliability of the BGA (semiconductor device) 7 can be improved.

Since other advantageous effects that can be attained by the first to fourth modifications mentioned above are the same as the other advantageous effects that can be attained by the manufacturing method of the QFP 1 shown in FIG. 1, their repeated description is omitted.

It is needless to mention that while the invention made by the present inventors have been specifically described on the basis of its embodiments, the present invention is not limited to the embodiments of the invention mentioned above but various changes are possible without departing from the scope of the invention.

For example, during bail bonding in the assembly of the QFP 1 according to the above-mentioned embodiments, in each of the electrode pads of the semiconductor chip which are arrayed along the ultrasonic wave application direction, when coupling the bail at the tip of the copper wire and the electrode pad to each other while rubbing the ball and the electrode pad against each other in a second direction transverse to the ultrasonic wave application direction, the ball and the electrode pad are rubbed against each other by moving the bonding head side. However, instead of moving the bonding head side, the stage side where the semiconductor chip is mounted may be moved to rub the ball and the electrode pad against each other.

Also, as long as the above-mentioned semiconductor device is a semiconductor package assembled by performing the ball bonding according to this embodiment, the semiconductor device may be a Quad Flat Non-leaded Package (QFN) or a Small Outline Package (SOP), or further, a Land Grid Array (LGA) or the like other than the QFP 1 or the BGA 7, and the present invention can be applied to all semiconductor packages that are assembled by performing the above-mentioned ball bonding.

The present invention is suitable for the assembly of an electronic device in which ball bonding is performed.

What is claimed is:

1. A manufacturing method of a semiconductor device which method forms a ball at a tip of a conductive wire passed through a capillary as a bonding tool, and performs wire bonding of the ball to an electrode pad of a semiconductor chip, comprising the steps of:
   (a) providing the semiconductor chip having a plurality of electrode pads formed in a main surface thereof, each of said electrode pads having aluminum as a principal component; and
   (b) applying an ultrasonic wave along an application direction to electrically couple the ball at the tip of the conductive wire to each of the electrode pads, the conductive wire having copper as a principal component,
   wherein in the step (b), when performing the wire bonding to, among the electrode pads, first electrode pads that are arrayed in a first direction along the application direction of the ultrasonic wave, the ball and each of the first electrode pads are coupled to each other while being rubbed against each other along a second direction transverse to the application direction of the ultrasonic wave.

2. The manufacturing method of a semiconductor device according to claim 1, comprising, in step (b):
   moving a bonding head supporting the capillary along the second direction while the ball and each of the first electrode pads are being electrically coupled to each other.

3. The manufacturing method of a semiconductor device according to claim 2, wherein the first electrode pads are arrayed around a periphery of the main surface of the semiconductor chip.

4. The manufacturing method of a semiconductor device according to claim 1, wherein among the electrode pads in the main surface of the semiconductor chip, at least the first electrode pads that are arrayed in the first direction along the application direction of the ultrasonic wave have a rectangular shape with a long dimension extending along the second direction.

5. The manufacturing method of a semiconductor device according to claim 1, wherein the conductive wire has a surface coated with a palladium plating.

6. The manufacturing method of a semiconductor device according to claim 1, comprising, in step (b):
   reciprocating a bonding head supporting the capillary along the second direction while the ball and each of the first electrode pads are being electrically coupled to each other.

7. The manufacturing method of a semiconductor device according to claim 1, wherein the electrode pads comprise second electrode pads arranged along the second direction, the method further comprising:
   applying the ultrasonic wave to the second electrode pads along the application direction to electrically couple the ball and each of the second electrode pads.

8. The manufacturing method of a semiconductor device according to claim 7, comprising;
   applying the ultrasonic wave to the second electrode pads without rubbing the ball and each of the second electrode pads against each other along the second direction.

9. A manufacturing method of a semiconductor device which method forms a ball at a tip of a conductive wire passed through a capillary as a bonding tool, and performs wire bonding of the ball to an electrode pad of a semiconductor chip, comprising the steps of:
   (a) providing a multiple lead frame having a plurality of device areas provided in a matrix arrangement, the device areas each having a chip mounting part suitable for receiving a semiconductor chip, and a plurality of leads arranged around the chip mounting part;
   (b) mounting a semiconductor chip having a plurality of electrode pads formed in a main surface thereof in one of the chip mounting parts, each of said electrode pads having aluminum as a principal component;
   (c) applying an ultrasonic wave along an application direction to electrically couple the ball at the tip of the conductive wire to each of the electrode pads of the semiconductor chip, the conductive wire having copper as a principal component and being guided by the capillary;
   (d) sealing the conductive wire and the semiconductor chip with a sealing resin; and
   (e) cutting/severing the leads projecting from a seal formed by the sealing resin, from the lead frame,
   wherein in the step (c), when performing the wire bonding to, among the electrode pads, first electrode pads that are arrayed in a first direction along an application direction of the ultrasonic wave, the ball and each of the electrode pads are coupled to each other while being rubbed against each other along a second direction transverse to the application direction of the ultrasonic wave.

10. The manufacturing method of a semiconductor device according to claim 9, comprising, in step (c):
    moving a bonding head supporting the capillary along the second direction while the ball and each of the first electrode pads are being electrically coupled to each other.

11. The manufacturing method of a semiconductor device according to claim 10, wherein the first electrode pads are arrayed around a periphery of the main surface of the semiconductor chip.

12. The manufacturing method of a semiconductor device according to claim 9, wherein among the electrode pads in the main surface of the semiconductor chip, at least the first electrode pads that are arrayed in the first direction along the application direction of the ultrasonic wave have a rectangular shape with a long dimension extending along the second direction.

13. The manufacturing method of a semiconductor device according to claim 9, wherein the conductive wire has a surface coated with a palladium plating.

14. The manufacturing method of a semiconductor device according to claim 9, comprising, in step (c):
  reciprocating a bonding head supporting the capillary along the second direction while the ball and each of the first electrode pads are being electrically coupled to each other.

15. The manufacturing method of a semiconductor device according to claim 9, wherein the electrode pads comprise second electrode pads arranged along the second direction, the method further comprising:
  applying the ultrasonic wave to the second electrode pads along the application direction to electrically couple the ball and each of the second electrode pads.

16. The manufacturing method of a semiconductor device according to claim 15, comprising;
  applying the ultrasonic wave to the second electrode pads without rubbing the ball and each of the second electrode pads against each other along the second direction.

17. An ultrasonic wire bonding method for electrically coupling a ball at a tip of a conductive wire to each of a plurality of electrode pads associated with a semiconductor chip by means of a bonding tool having a capillary through which the conductive wire is passed, the conductive wire having copper as a principal component, the electrode pads having aluminum as a principal component, the method comprising:
  (a) providing a semiconductor chip having a plurality of electrode pads formed in a main surface thereof, the electrode pads including first electrode pads arrayed in a first direction of the semiconductor device and second electrode pads arrayed in a second direction of the semiconductor device, the second direction being transverse to the first direction;
  (b) applying an ultrasonic wave along an application direction to electrically couple the ball at the tip of the conductive wire to each of the first electrode pads, the application direction being the same direction as the first direction along which the first electrode pads are arrayed; and
  (c) applying an ultrasonic wave along said application direction to electrically couple the ball at the tip of the conductive wire to each of the second electrode pads; and
  in step (b), applying the ultrasonic wave along said application direction, while rubbing the ball and each of the first electrode pads against each other along the second direction.

18. The ultrasonic wire bonding method according to claim 17, comprising, in step (b), moving a bonding head supporting the capillary along the second direction while the ball and each of the first electrode pads are being electrically coupled to each other.

19. The ultrasonic wire bonding method according to claim 17, comprising, in step (b), reciprocating a bonding head supporting the capillary along the second direction while the ball and each of the first electrode pads are being electrically coupled to each other.

20. The ultrasonic wire bonding method according to claim 17, comprising, in step (c), applying the ultrasonic wave along said application direction, without rubbing the ball and each of the second electrode pads against each other along the second direction.

21. The ultrasonic wire bonding method according to claim 17, wherein the electrode pads are arrayed around a periphery of the main surface of the semiconductor chip.

22. The ultrasonic wire bonding method according to claim 17, wherein the first electrode pads have a rectangular shape with a long dimension extending along the second direction.

23. The ultrasonic wire bonding method according to claim 17, wherein the conductive wire has a surface coated with a palladium plating.

* * * * *